(12) United States Patent
Jahkonen

(10) Patent No.: US 7,960,865 B2
(45) Date of Patent: Jun. 14, 2011

(54) APPARATUS AND METHOD FOR CONTROLLING THE MOTOR POWER

(75) Inventor: Pekka Jahkonen, Hyvinkää (FI)

(73) Assignee: Kone Corporation, Helsinki (FI)

( * ) Notice: Subject to any disclaimer, the term of this patent is extended or adjusted under 35 U.S.C. 154(b) by 24 days.

(21) Appl. No.: 12/508,615

(22) Filed: Jul. 24, 2009

(65) Prior Publication Data

US 2009/0284079 A1    Nov. 19, 2009

Related U.S. Application Data

(63) Continuation of application No. PCT/FI2008/000007, filed on Jan. 17, 2008.

(30) Foreign Application Priority Data

Feb. 15, 2007    (FI) ...................................... 20070136

(51) Int. Cl.
*H02J 3/00* (2006.01)
(52) U.S. Cl. ....................................................... 307/82
(58) Field of Classification Search ............... 363/34, 363/35, 37; 307/82
See application file for complete search history.

(56) References Cited

U.S. PATENT DOCUMENTS

| | | | | |
|---|---|---|---|---|
| 3,500,057 A | * | 3/1970 | Stackegard | 307/82 |
| 4,709,318 A | * | 11/1987 | Gephart et al. | 363/37 |
| 4,992,925 A | * | 2/1991 | Meyer | 363/37 |
| 5,184,291 A | | 2/1993 | Crowe et al. | |
| 5,631,813 A | * | 5/1997 | Ikeshita | 363/37 |
| 2004/0012983 A1 | | 1/2004 | Fearing et al. | |
| 2004/0207968 A1 | * | 10/2004 | Martin et al. | 361/100 |

FOREIGN PATENT DOCUMENTS

| | | |
|---|---|---|
| EP | 0 693 820 A1 | 1/1996 |
| EP | 1 191 207 A2 | 3/2002 |
| GB | 2 214 731 A | 9/1989 |
| JP | 406078562 A  * | 3/1994 |
| JP | 2005-117783 A | 4/2005 |
| JP | 2007-6565 A | 1/2007 |
| WO | WO-95/01669 A1 | 1/1995 |
| WO | WO-95/06973 A1 | 3/1995 |

OTHER PUBLICATIONS

Machine translation for Hatosaki et al.*

* cited by examiner

*Primary Examiner* — Fritz M Fleming
(74) *Attorney, Agent, or Firm* — Birch, Stewart, Kolasch & Birch, LLP

(57) ABSTRACT

The invention concerns a power control apparatus and a method for supplying power between an electric machine and an energy source. The power control apparatus contains at least two converters comprising a plurality of switches, at least some of which switches belong to a set of switch modules comprising a plurality of switches. In the method of the invention, a first set of switches belonging to at least two different modules and arranged to form a first converter is controlled by a first converter control, and a second set of switches arranged to form a second converter is controlled by a second converter control.

18 Claims, 3 Drawing Sheets

APPARATUS AND METHOD FOR CONTROLLING THE MOTOR POWER

This application is a Continuation of PCT/FI2008/000007 filed on Jan. 17, 2008, and claims priority under 35 U.S.C. §119(a) on Patent Application No. 20070136 filed in Finland on Feb. 15, 2007, respectively, all of which are hereby expressly incorporated by reference into the present application.

FIELD OF THE INVENTION

The present invention relates to a power control apparatus as defined in the preamble of claim 1 and to a method as defined in the preamble of claim 15 for controlling a power control apparatus.

PRIOR ART

Modern motor power control apparatuses supply power between a supply network and an electric power machine, such as an electric motor, in both directions. The control apparatus contains a mains inverter, which is used to convert the supply network voltage into a direct voltage, and a load-side inverter by means of which the direct voltage is converted into an alternating voltage of varying amplitude and frequency for the electric motor. The load-side inverter supplies power between a direct-voltage intermediate circuit of the power control apparatus and the motor, and the mains inverter supplies power between the supply network and the direct-voltage intermediate circuit.

The magnitude of the current flowing through the switches of the mains inverter at a given instant of time depends on the supply network voltage and the amount of power taken from the supply network. This is subject to the effects of the currents and voltages of the load-side inverter. The current through the load-side inverter depends on the torque of the motor. The magnitude of the phase voltage of the motor again is greatly dependent on the electromotive force of the motor, whose magnitude increases as the rotational speed of the motor increases. When the rotational speed of the motor is increasing while the torque remains constant, the power taken by the motor from the supply network increases, and therefore the mains inverter current also increases. In motor drives where a high torque is needed at a low rotational speed, the current through the load-side inverter may be multiple times larger than the mains inverter current. The instantaneous power requirement of the motor may be high, e.g. if a high torque is needed momentarily during acceleration or deceleration of the motor. When the motor is rotating at its nominal speed, the current through the mains inverter and the current through the load-side inverter are again about equal. This may be the situation e.g. in the drives of different transport apparatus, such as elevators, in which a mass of a certain magnitude is accelerated to a constant speed.

If the load-side inverter is required to control a large current with a low frequency of the fundamental voltage and current wave, the current will change temporally slowly, flowing continuously for a long time through the same bidirectional switch. In this case, at least one bidirectional switch is continuously switched with a large current. Therefore, the power losses are unequally distributed between the bidirectional switches of the load-side inverter, and the bidirectional switch having the largest current is heated most. In this situation, the maximum current through the load-side inverter is determined on the basis of the bidirectional switch that remains continuously turned on for a long time. Such a situation may occur e.g. in an elevator drive when the elevator car is held immovable by the torque produced by the motor. In this case, the frequency of the current is low and the maximum current may flow for a long time through only one bidirectional switch.

The switches used in electronic power converters are generally semiconductors, such as IGBT transistors. In this type of semiconductors there occur losses, which can be divided into conduction losses and switching losses. Conduction losses occur when a current is flowing through a conducting semiconductor. Switching losses occur in connection with the switching action of the semiconductor, both when the semiconductor is switched on into the conducting state and when its is switched off. Switching losses are increased as a function of frequency, in such manner that in many IGBT transistor types the conduction losses and switching losses are of equal magnitude at a switching frequency of about 10 kilohertz. Commercial semiconductors are generally delivered as semiconductor modules typically containing six semiconductors arranged as three bidirectional switches.

A short-duration current causes heating of the semiconductor module, but a heat sink attached to the semiconductor module is heated more slowly and the heating time constant depends on the size of the heat sink. If the duration of the current is so short that only the semiconductor module and possibly part of the heat sink become heated, then increasing the size of the heat sink will not increase the current capacity of the semiconductor module, but a semiconductor module having a lower power dissipation and designed for larger currents is needed. This increases the costs.

If the current flows uninterruptedly through the same semiconductor for a long time, this semiconductor constitutes a point-like power dissipation source and the semiconductor module is intensively heated in the vicinity of the power dissipation source. In this case the heat sink is again unable to dissipate enough heat to the environment, but the local heating of the semiconductor module caused by the point-like power dissipation source limits the current capacity of the semiconductor module. This has the consequence that the design current capacity of the semiconductor module has to be increased if necessary to a semiconductor module having a lower power dissipation, which means increasing the costs.

As the power dissipation of a semiconductor is proportional to the current, it is also possible to reduce the power dissipation by arranging for the current to flow through a plurality of semiconductors connected in parallel. In this case, the power dissipation of an individual semiconductor is reduced, but the total power dissipation of the semiconductors in the semiconductor module remains unchanged, because power dissipation occurs in a plurality of semiconductors.

Specification U.S. Pat. No. 5,184,291 A discloses a solution where the phases of a converter can be implemented as separate modules.

Specification JP 2005117783 A discloses a solution where a plurality of switch components comprised in the same converter are placed on the same heat sink.

Specification EP 1191207 A2 discloses a chopper designed to be connected to the DC intermediate circuit of a converter and backed by an energy source.

OBJECT OF THE INVENTION

The object of the invention is to disclose a power supply apparatus in which the switch modules are more equally heated than in prior-art power supply apparatuses. As the temperature of the switch module determines the current capacity of the module, it is also an object of the invention to disclose a power supply apparatus that has a higher current capacity than prior-art power supply apparatuses containing corresponding switch modules. A further object of the invention is to disclose a method for controlling the switches of the power supply apparatus so as to equalize the heating of the switch modules.

FEATURES OF THE INVENTION

The power supply apparatus of the invention is characterized by what is disclosed in the characterizing part of claim 1. The method of the invention for controlling a power supply apparatus is characterized by what is disclosed in the characterizing part of claim 15. Other aspects of the invention are characterized by what is disclosed in the other claims. Inventive embodiments are also presented in the description part of the present application. The inventive content disclosed in the application can also be defined in other ways than is done in the claims below. The inventive content of the application can also be defined in other ways than is done in the claims presented hereinafter. The inventive content may also consist of several separate inventions, especially if the invention is considered in the light of explicit or implicit sub-tasks or with respect to advantages or sets of advantages achieved. In this case, some of the attributes contained in the claims below may be superfluous from the point of view of separate inventive concepts.

The power control apparatus of the invention has been adapted to supply power between an electric machine and an energy source. The electric machine may be e.g. an electric motor or generator. An electric motor may also function in generator mode, e.g. when a conveying apparatus is braked by means of the motor. During operation in generator mode, power is returned from the electric machine, and therefore the power control apparatus may be adapted to supply power back into the energy source, or e.g. into a separate energy storage, such as an accumulator, a supercapacitor, a flywheel or for use as potential energy of a displaceable weight. The aforesaid energy source may be e.g. an electric network, a generator or a DC voltage source, or e.g. an accumulator or a supercapacitor.

A power control apparatus according to the invention contains at least two converters comprising a plurality of switches, at least some of which switches are comprised in a set of switch modules comprising a plurality of switches. At least one of the converters contains switches belonging to at least two modules, and switches of at least one module belong to two or more converters. As switches of one converter belong to at least two different modules, the power dissipation of the switches of the converter is distributed more equally among different switch modules.

In another power control apparatus according to the invention, each one of the aforesaid converters comprises one or more switches in each one of the aforesaid switch modules.

In a power control apparatus according to the invention, at least one converter comprises at least two bidirectional switches connected in parallel. The current flowing in a bidirectional switch can be distributed between the two parallel-connected bidirectional switches, which improves the current capacity of the bidirectional switches.

The power control apparatus of the invention may comprise a three-phase mains inverter and a three-phase load-side inverter with a common direct-voltage intermediate circuit shared by both inverters, which comprise three switch modules in all, each switch module consisting of three bidirectional switches. In an embodiment of the invention, the three-phase mains inverter contains three bidirectional switches, one for each phase, each one of said bidirectional switches being placed in a different switch module. In another embodiment according to the invention, the three-phase load-side inverter contains six bidirectional switches in all, two parallel-connected bidirectional switches for each phase in each switch module.

In a power control apparatus according to the invention, each switch module consists of three bidirectional switches placed side by side, the mains inverter phase comprises the bidirectional switch at the middle of the switch module while the load-side inverter phase comprises a parallel connection of the two outermost bidirectional switches of the switch module.

A power control apparatus according to the invention contains one or more power control units, each one of said power control units comprising a switch module, an energy source fitted in the intermediate circuit of the switch module for the storage of intermediate circuit energy, and means for controlling the bidirectional switches of the switch module and means for electrically interconnecting the intermediate circuits of two or more switch modules between different power control units. The power control unit may comprise a circuit board to which the switch module is electrically conductively connected. 'Energy source fitted in the intermediate circuit of the power control unit' may refer to one or more intermediate circuit capacitors, and these may also be electrically conductively connected to the aforesaid circuit board. The means for electrically interconnecting the intermediate circuits of two or more switch modules between different power control units may comprise a connector electrically conductively connected to the circuit board.

In a preferred embodiment of the invention, the power control apparatus comprises a three-phase mains inverter and a three-phase load-side inverter, which consist of a total of three power control units, each of which power control units comprises a switch module, which switch module further comprises three bidirectional switches placed side by side and each power control unit comprises means for controlling the two outermost bidirectional switches of the switch module in parallel by load-side inverter control and means for controlling the middle bidirectional switch by mains inverter control.

The power control unit of the invention may comprise a separate heat sink attached to the switch module. There may also be a fan attached to the heat sink for more intensive cooling, or a fan may be shared by several power control units.

A power control apparatus according to the invention is provided with a DC-DC chopper comprising a plurality of switches of which at least some belong to at least two switch modules comprising a plurality of switches.

A power control apparatus according to the invention has a common direct-voltage intermediate circuit and a DC-DC chopper is adapted to supply power between the intermediate circuit of the power control apparatus and the energy source. Provided in conjunction with the DC-DC chopper there may also be other components required for the operation of the chopper, such as a choke unit electrically conductively connected between the chopper and the energy source. The energy source connected to the chopper may be e.g. a storage battery or a supercapacitor. If the energy source used is a set of battery cells, then the chopper may comprise at least means for charging and discharging the battery and means for monitoring the state of discharge of the battery, and means for generating a failure signal on the basis of the monitoring data on the state of discharge of the battery. If the energy source is a supercapacitor, then the chopper may comprise at least means for measuring and/or adjusting the current and/or voltage of the capacitor, as well as means for charging and discharging the capacitor and means for detecting the state of charge of the capacitor. Further, the chopper may comprise means for generating a failure signal on the basis of a comparison between the state of charge of the capacitor and the control of the chopper.

A power control apparatus according to the invention comprises a common direct-voltage intermediate circuit and the apparatus comprises at least two load-side inverters electrically connected to the common direct-voltage intermediate circuit. The load-side inverters are adapted to supply power between the common direct-voltage intermediate circuit and one or more electric machines.

In a power control apparatus according to the invention; at least one of the switches is an IGBT transistor.

In a power control apparatus according to the invention, all the switch modules are attached to a common heat sink. Furthermore, a fan may be arranged in connection with the heat sink for more intensive cooling.

A power control apparatus according to the invention is adapted to supply power between an elevator motor and an energy source. Power may be supplied e.g. between an electric network and the elevator motor or between a separate energy source and the elevator motor. The elevator motor may be part of an elevator system with or without counterweight. The solution disclosed in the invention is applicable for use both in elevator systems having a machine room and in elevator systems having no machine room.

In a method according to the invention for supplying power between an electric machine and an energy source by means of a power control apparatus, the power control apparatus comprises at least two converters comprising a plurality of switches, at least some of said switches belonging to a set of switch modules comprising a plurality of switches. In the method of the invention, a first set of switches belonging to at least two different modules and arranged as a first converter is controlled by a first converter control procedure. In a method according to the invention, a second set of switches arranged as a second converter is controlled by a second converter control procedure.

In a method according to the invention, the switches of at least one module, which are arranged to form part of at least two different converters, are controlled by at least two different converter control procedures. Examples of such converter control procedures include mains inverter control and load-side inverter control.

In a method according to the invention, at least two switches in each module are controlled by converter control of at least two different converters.

A method according to the invention concerns a power control apparatus in which each switch module consists of three bidirectional switches placed adjacently to each other. In this preferred embodiment of the invention, the mains inverter phase comprises the middle bidirectional switch of the switch module while the load-side inverter phase comprises a parallel connection of the outermost bidirectional switches of the switch module. In the method, the middle bidirectional switch of the first switch module is controlled by the control of the first phase of the mains inverter, the middle bidirectional switch of the second switch module is controlled by the control of the second phase of the mains inverter and the middle bidirectional switch of the third switch module is controlled by the control of the third phase of the mains inverter. In addition, in this method according to the invention, the two outermost bidirectional switches of the first switch module are controlled simultaneously by the control of the first phase of the load-side inverter, the two outermost bidirectional switches of the second switch module are controlled simultaneously by the control of the second phase of the load-side inverter and the two outermost bidirectional switches of the third switch module are controlled simultaneously by the control of the third phase of the load-side inverter.

In a method according to the invention, the middle bidirectional switch of the first switch module is controlled by the control of the first phase of the mains inverter, the middle bidirectional switch of the second switch module is controlled by the control of the second phase of the mains inverter and the middle bidirectional switch of the third switch module is controlled by the control of the third phase of the mains inverter. The two parallel-connected outermost bidirectional switches of the first switch module are controlled alternately by the control of the first phase of the load-side inverter, the two parallel-connected outermost bidirectional switches of the second switch module are controlled alternately by the control of the second phase of the load-side inverter and the two parallel-connected outermost bidirectional switches of the third switch module are controlled alternately by the control of the third phase of the load-side inverter in such manner that the positive and negative change-over contacts of the bidirectional switches being controlled are turned alternately to the conducting state and both the positive and the negative change-over contacts of the bidirectional switches not being controlled are held in the non-conducting state.

In a method according to the invention, the power dissipation of two or more switch modules containing only some of the parallel-connected bidirectional switches of the same phase is determined. According to the invention, it is further possible to control the parallel-connected bidirectional switches of the same phase placed in different modules alternately in such manner that the loads on the parallel-connected bidirectional switches relative to each other are varied by varying the conduction times of the bidirectional switches relative to each other. The parallel-connected bidirectional switch of a switch module having a higher power dissipation is turned to the conducting state for a shorter time than the bidirectional switch of a switch module having a lower power dissipation.

In an embodiment of the invention, the power control apparatus comprises at least a first and a second converter. The power control apparatus thus comprises at least one switch module containing bidirectional switches of both the first and the second converter. In this embodiment of the invention, the bidirectional switches of the first converter that are placed in the aforesaid switch module are fitted interjacently with the bidirectional switches of the second converter that are placed in said switch module.

ADVANTAGES OF THE INVENTION

When the motor is rotating at a low speed but a high momentary torque is required, as in an elevator drive during acceleration, the current through the load-side inverter is substantially larger than the current through the mains inverter. In this situation, high power dissipation occurs in the bidirectional switches of the load-side inverter and the switch module is intensively heated in the vicinity of the switches. When the phase current of the load-side inverter is distributed among several parallel-connected bidirectional switches and these bidirectional switches are placed at a distance from each other, the power dissipation in the switch modules is equalized and local heating is reduced. As the switch modules are more equally heated, they can be designed for larger currents or correspondingly smaller switch modules can be used for controlling the same current, thus reducing the costs. This method provides an advantage especially in drives in which the momentary current requirement of the load-side inverter is considerably higher than the long-time average current requirement. This type of drives include e.g. elevator drives, in which a high momentary current is needed for acceleration.

In motor drives requiring a high torque with a low motor current frequency, such as e.g. in an elevator drive during fine positioning of the elevator car at a landing, the bidirectional switches of the same phase of the load-side inverter conduct a large current for a long time. Therefore, the switch module is intensively heated in the vicinity of the bidirectional switches. If the current is distributed between the outermost bidirectional switches of the three-phase switch module via parallel connection, the switch module will be more equally heated. Thus, it is possible to use semiconductors designed for a smaller current. Power dissipation can be further equalized by distributing the parallel-connected bidirectional switches among several switch modules.

If the semiconductor module is heated in a point-like manner, then the heat sink also receives more heat in the vicinity of the point-like heat source. In this situation, the heat sink can not transfer heat efficiently from the switch module to the environment. When the switch modules are equally heated, the heat sink is also more evenly heated and transfers heat more efficiently to the environment. As the heating occurs uniformly, it is possible to use a smaller heat sink and fan, thereby reducing the size of the power control apparatus. This provides an advantage especially in applications where space is a critical factor. E.g. in elevator systems, a transition to solutions without counterweight in which the power control apparatus is often disposed in the elevator shaft has taken place, a small size of the power control apparatus being therefore desirable.

In the power control apparatus of the invention, it is possible to use commercial three-phase semiconductor modules which contain three bidirectional switches. In conjunction with the modules it is possible to connect an intermediate-circuit energy source and a heat sink, and thus separate power control units can be formed according to the invention. By modularly combining such power control units, it is possible to construct different power control apparatuses. For example, a DC-DC chopper can be formed by using a similar power control unit. When the number of converters in the power control apparatus increases, the switches of different converters can be further distributed among different switch modules into several different combinations, power dissipation between the modules can be further equalized and the current capacity of the modules improved. By modularly combining identical power control units, an advantage is also achieved regarding the cost of large production series.

When at least one switch module comprised in the power control apparatus contains bidirectional switches of at least two different converters, said converters belonging to said power control apparatus, and bidirectional switches of a first converter in the aforesaid switch module are fitted interjacently with bidirectional switches of a second inverter in the switch module, the switch module is more equally heated than e.g. in prior-art applications where the switch modules belonging to the power control apparatus comprise bidirectional switches of only one converter. For example, if several bidirectional switches are connected in parallel to the phases of one converter, such as a three-phase load-side inverter, in such manner that the phase current is distributed among the parallel-connected bidirectional switches, and if the bidirectional switches of the load-side inverter are so fitted in different switch modules that one module contains bidirectional switches of at least two different phases of the load-side inverter, then, in a certain situation in the control, the adjacently fitted bidirectional switches of different phases of the said switch module still carry simultaneously a large momentary current. If e.g. the load-side inverter feeds a symmetric load, such as star-connected motor windings, in a certain situation in the control, when the phase current in one phase of the load-side inverter is near zero, the other two phases of the load-side inverter carry momentarily a large current. When at least two bidirectional switches of different phases of the load-side inverter are now fitted mutually adjacently in the switch module, a large current flows momentarily in the adjacently fitted bidirectional switches, and consequently the switch module is locally heated in the area of these bidirectional switches. The heat sink can thus not transfer heat effectively from the switch module to the environment, which limits the current capacity of the switch module. If instead the aforesaid bidirectional switches of the load-side inverter were fitted, as proposed in the invention, e.g. interjacently with the bidirectional switches of another converter, such as a mains inverter, comprised in the same power control apparatus, then the switch module would be more equally heated, the heat sink would transfer heat more effectively from the switch module to the environment, and the current capacity of the switch would be increased.

In an embodiment of the invention where the power control apparatus comprises a load-side inverter and a mains inverter, two parallel-connected bidirectional switches can be fitted in each phase of the load-side inverter and a corresponding switch can be fitted in each phase of the mains inverter, as proposed in the invention. In this case, the power control apparatus can be formed from three switch modules each containing three bidirectional switches, in such manner that the middle switch of each switch module is fitted in a phase of the mains inverter and the outermost bidirectional switches are fitted as a parallel connection in a phase of the load-side inverter. Because in many drives, such as in an elevator drive at low speeds, the bidirectional switches of the load-side inverter are heated more than the bidirectional switches of the mains inverter, this type of switch topology can be used to improve the current capacity of the power control apparatus.

EMBODIMENT EXAMPLES

Figure 1:
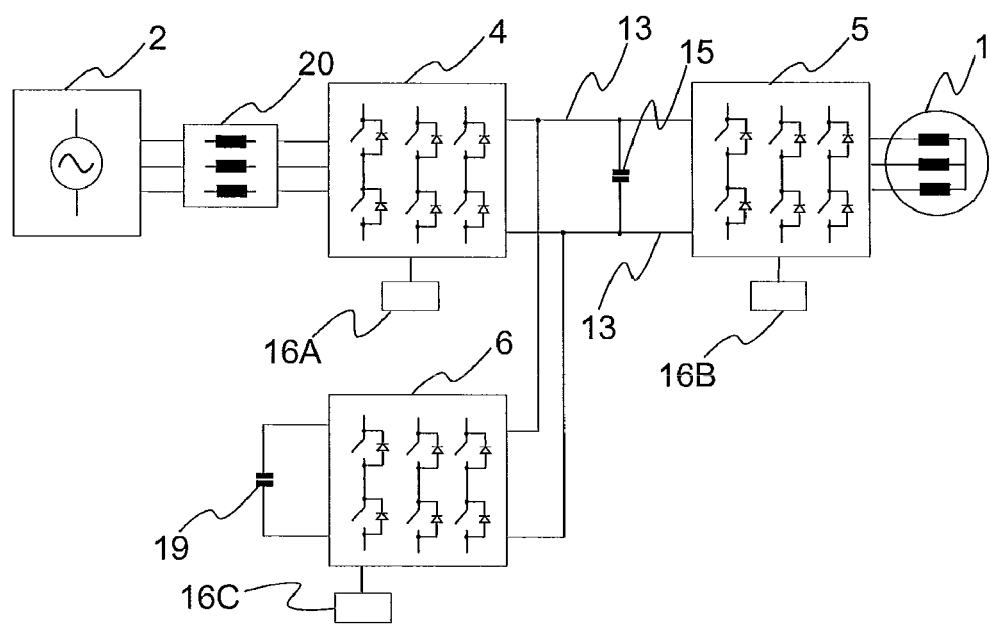
FIG. 1 represents a power control apparatus according to the invention

FIG. 1 shows a power control apparatus according to the invention. The power control apparatus comprises a mains inverter 4 and, in connection with the mains inverter, an inductor unit 20. The mains inverter and an load-side inverter 5 are connected to a common direct-voltage intermediate circuit 13. The direct-voltage intermediate circuit has a capacitor 15 as an energy storage. Connected to the direct-voltage intermediate circuit is additionally a DC-DC chopper 6, which supplies energy between establish direct-voltage intermediate circuit 13 and the energy source 19. The load-side inverter 5 supplies a motor 1 with a voltage varying in frequency and amplitude. During acceleration of the motor, the power control apparatus, controlled by mains inverter control 16A, supplies power from the mains network 2 via the mains inverter 4 to the direct-voltage intermediate circuit 13 and further, controlled by load-side inverter control 16B, via the load-side inverter 5 to the motor 1. During deceleration, the motor functions as a generator and power is transmitted through the load-side inverter to the direct-voltage intermediate circuit and further through the mains inverter to the mains network.

The energy generated during deceleration need not necessarily be returned to the supply network 2, but it can be stored in the energy storage 19. In this case, the mains inverter control 16A prevents supply of power into the network and the power is transferred under control 16C via the DC-DC chopper into the energy storage 19.

Figure 2:
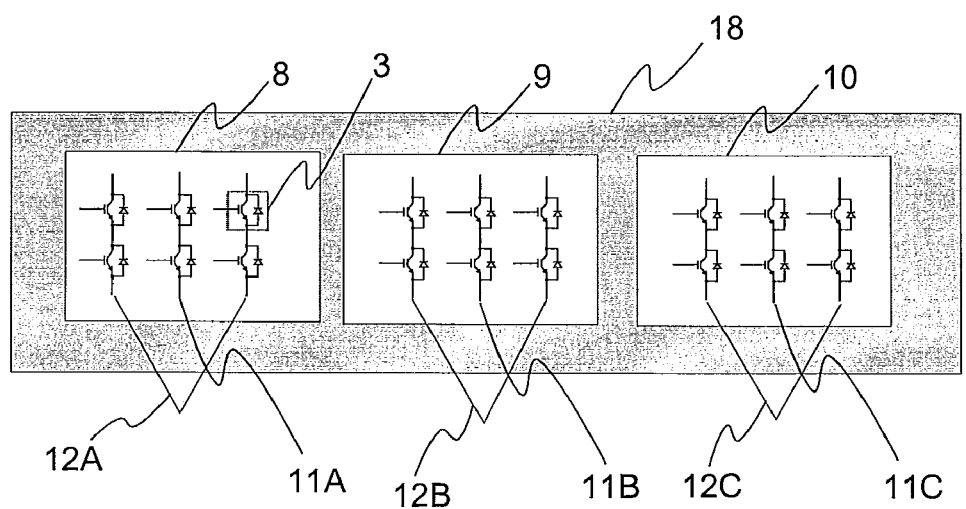
FIG. 2 illustrates switch arrangement according to the invention.

FIG. 2 shows three switch modules 8,9,10 that may be used in the power control apparatus of the invention. The switch modules are attached to a common heat sink 18. Each switch module contains three bidirectional switches 11, 12. The middle switch 11A, 11B, 11C of each switch module is connected to a phase of the mains inverter 4. The outermost bidirectional switches of the switch modules are connected in parallel and the parallel connections 12A, 12B, 12C of the bidirectional switches are connected to phases of the load-side inverter 5. In an elevator drive, a solution like this is advantageous because during acceleration of the elevator motor the current through the load-side inverter 5 equals about twice the current through the mains inverter 4.

Figure 3:
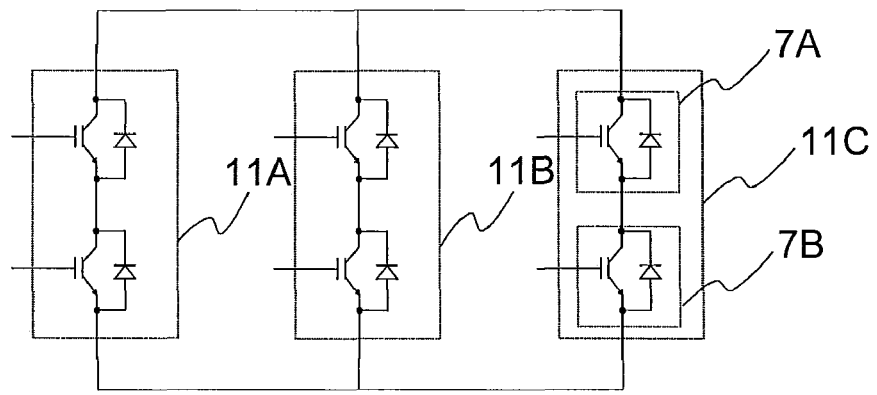
FIG. 3 represents a mains inverter according to the invention.

FIG. 3 presents a bridge connection of the mains inverter. Connected to each phase is one bidirectional switch 11A, 11B, 11C. The bidirectional switch is controlled by alternately connecting the positive change-over contact 7A to the positive voltage potential of the intermediate circuit and the negative change-over contact 7B to the negative voltage potential of the intermediate circuit.

Figure 4:
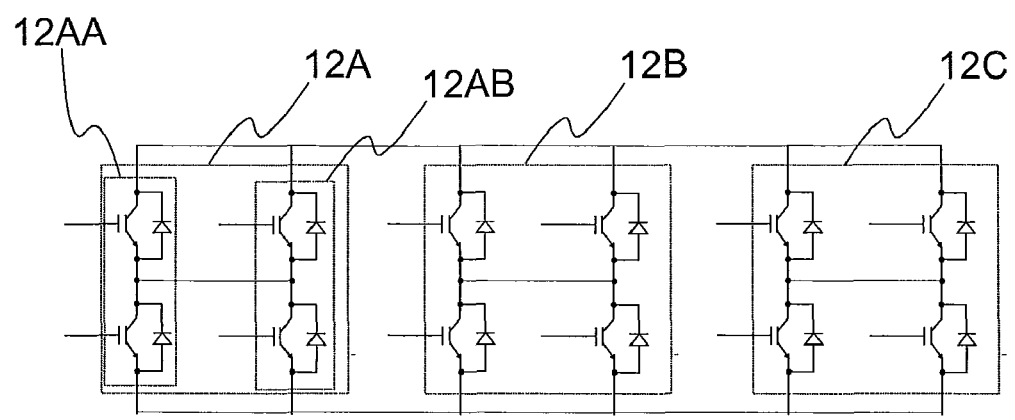
FIG. 4 represents an load-side inverter according to the invention.

FIG. 4 presents a bridge connection of the load-side inverter. As shown in the figure, two bidirectional switches 12AA and 12AB are connected in parallel in each one of the three phases of the inverter, thus forming parallel connections 12A, 12B and 12C. In this circuit, the phase current of the inverter is distributed equally among the parallel-connected bidirectional switches. The bidirectional switches 12 of the same phase can be disposed at a distance from each other, e.g. as the outermost bidirectional switches of the three-phase switch module 8,9,10, or they can also be placed in different switch modules. When the parallel-connected bidirectional switches of the same phase are not placed adjacently to each other in the switch modules, their power dissipation is distributed over a larger area and no point-like heating occurs. A risk of such point-like heating is present e.g. when a bidirectional switch of the same phase conducts for a long time. The bidirectional switches can be controlled simultaneously in such manner that the positive or negative change-over contacts of the bidirectional switches 12AA and 12 AB are switched simultaneously into the conducting state. The bidirectional switches can also be controlled alternately in such manner that the positive or negative change-over contact of bidirectional switch 12AA and bidirectional switch 12AB is switched alternately into the conducting state while the positive and negative change-over contact of the other bidirectional switch is simultaneously switched into the non-conducting state. The conduction times of the bidirectional switches 12AA and 12AB relative to each other can also be so chosen that the bidirectional switch in the switch module having a higher power dissipation is held in the conducting state for a shorter time than the bidirectional switch in the switch module having a lower power dissipation. This allows equalization of power dissipation between switch modules.

Figure 5:
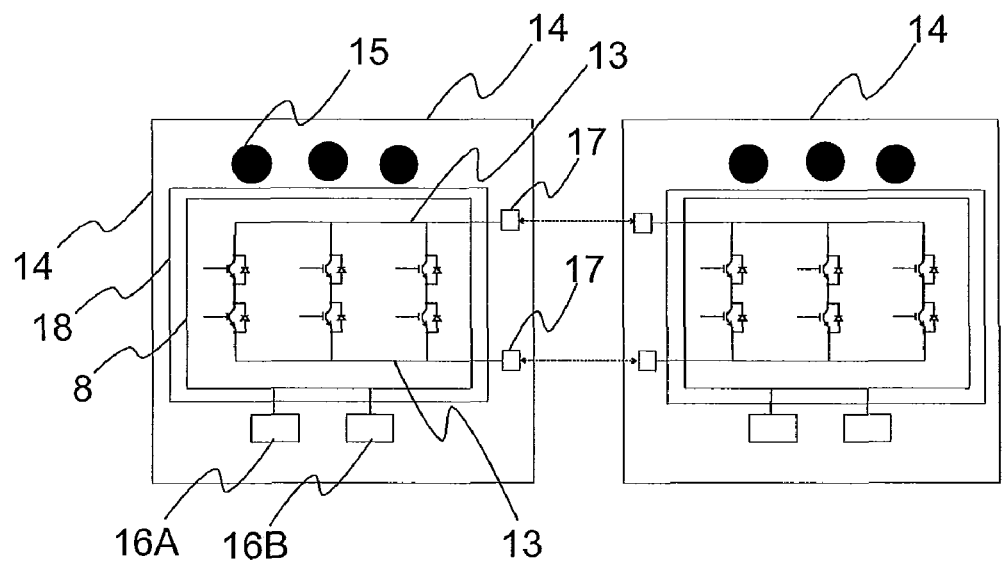
FIG. 5 represents a power supply unit according to the invention.

FIG. 5 visualizes a power control unit 14 according to the invention. The power control unit comprises an energy storage 15 for the storage of intermediate-circuit energy. This energy storage may be e.g. a capacitor in the intermediate circuit. In this preferred embodiment of the invention, the power control unit comprises a switch module 8 and a heat sink 18, to which the switch module is attached. The power control unit also comprises a mains inverter control 16A, allowing at least one of the bidirectional switches of the switch module 8 to be used as part of the mains inverter 4, and a load-side inverter control 16B, allowing at least one of the bidirectional switches of the switch module to be used as part of the load-side inverter. The power control unit may further comprise a DC-DC chopper control 16C, in which case at least one of the bidirectional switches of the switch module can be used as part of a possible DC-DC chopper. The power control unit 14 also comprises means 17 for connecting two or more power control units to a common direct-voltage intermediate circuit 13.

Figure 6:
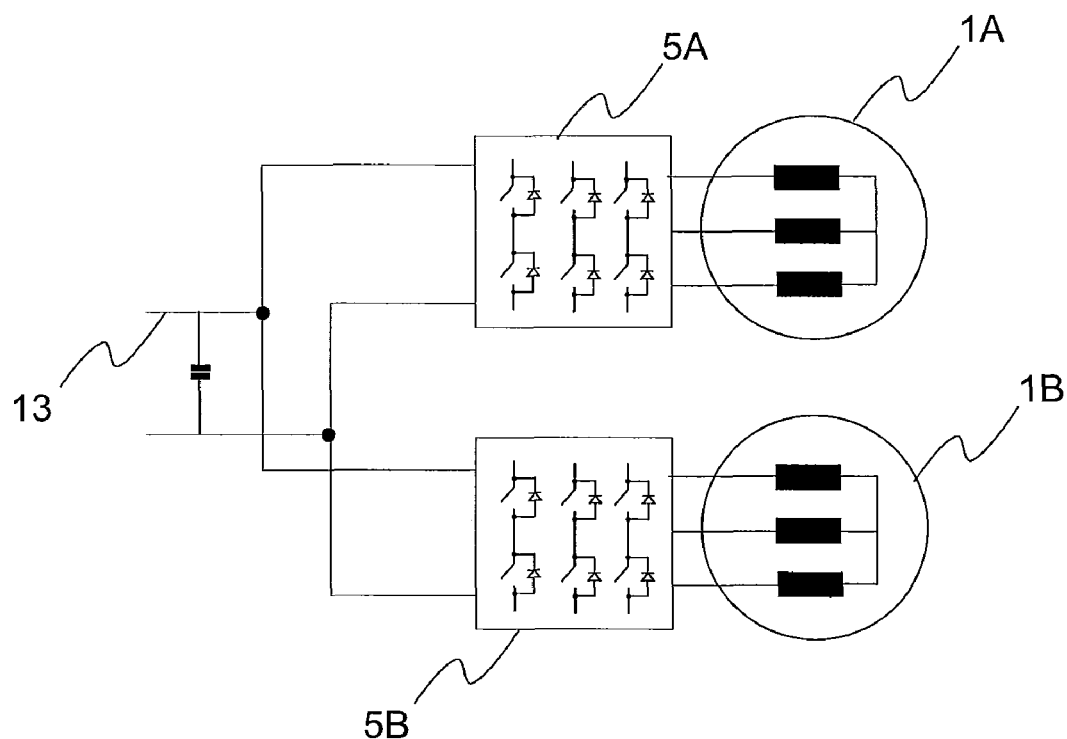
FIG. 6 represents a power supply apparatus according to the invention, wherein two load-side inverters connected to the same direct-voltage intermediate circuit are fitted to feed two electric motors.

FIG. 6 illustrates a power control apparatus according to the invention wherein two inverters 5A, 5B connected to the same direct-voltage intermediate circuit 13 are fitted to feed two electric motors. Both motors can function simultaneously in motor mode, with power supplied to the motors 1A, 1B from a mains supply 2 or an energy storage 19 via the direct-voltage intermediate circuit through the inverters 15A, 15B. The motors may also function simultaneously in generator mode, in which case both motors supply power through the inverters into the direct-voltage intermediate circuit, from where the power is further transferred alternatively either to the energy storage 19 or to the power supply 2. It is also possible for one of the motors to work in motor mode while the other one is working in generator mode, in which case at least some of the power returned into the intermediate circuit by the motor working in generator mode is circulated directly to the electric motor working in motor mode.

In the above, an elevator drive and drives of various transportation means have been proposed as applications of the invention. An advantageous application of the invention is a crane drive, in which a load is held momentarily in place by the torque produced by a motor. In this situation, the semiconductors of the inverter controlling the motor are heated unequally in the semiconductor modules. By using the apparatus and method of the invention, the heating of the semiconductor modules can be equalized in a crane drive as well while at the same time improving the current capacity of the semiconductor modules.

In the above, the invention has been described be referring to a few embodiment examples. However, it is obvious to the person skilled in the art that the invention is not limited to the embodiments described above, but that many variations and different embodiments of the invention are possible within the scope of the inventive concept defined in the claims presented below.

The invention claimed is:

1. A power control apparatus for supplying power between an electric machine and an energy source, said power control apparatus containing at least two converters comprising a plurality of switches, at least some of which switches belong to a set of switch modules comprising a plurality of switches, wherein at least one of the converters contains switches belonging to at least two modules and the switches of at least one module belong to two or more converters, wherein the power control apparatus comprises a three-phase mains inverter and a three-phase load-side inverter, which have a common direct-voltage intermediate circuit and which comprise three switch modules in all, each switch module consisting of three bidirectional switches and that the three-phase mains inverter contains three bidirectional switches one for each phase, each one of said bidirectional switches being placed in a different switch module, and that the three-phase load-side inverter contains six bidirectional switches in all, two parallel-connected bidirectional switches for each phase in each switch module.

2. The power control apparatus according to claim 1, wherein each one of the aforesaid converters comprises one or more switches in each one of the aforesaid switch modules.

3. The power control apparatus according to claim 2, wherein at least one converter comprises at least two bidirectional switches connected in parallel.

4. The power control apparatus according to claim 1, wherein at least one converter comprises at least two bidirectional switches connected in parallel.

5. The power control apparatus according to claim 1, wherein each switch module consists of three bidirectional switches placed side by side, the phase of the mains inverter comprises the middle bidirectional switch of the switch module while the load-side inverter phase comprises a parallel connection of the two outermost bidirectional switches of the switch module.

6. The power control apparatus according to claim 1, wherein the apparatus contains one or more power control units, each one of said power control units comprising a switch module, an energy source fitted in the intermediate circuit of the switch module for the storage of intermediate circuit energy, and means for controlling the bidirectional switches of the switch module and means for electrically interconnecting the intermediate circuits of two or more switch modules between different power control units.

7. The power control apparatus according to claim 6, wherein the power control apparatus comprises a three-phase mains inverter and a three-phase load-side inverter, which consist of a total of three power control units, each one of which each power control units comprises a switch module, which switch module further comprises three bidirectional switches placed side by side and each power control unit comprises means for controlling the two outermost bidirectional switches of the switch module in parallel by load-side inverter control and means for controlling the middle bidirectional switch by mains inverter control.

8. The power control apparatus according to claim 6, wherein the power control unit comprises a separate heat sink, which is attached to the switch module.

9. The power control apparatus according to claim 1, wherein the apparatus includes a DC-DC chopper comprising a plurality of switches, at least some of which switches belong to at least two switch modules comprising a plurality of switches.

10. The power control apparatus according to claim 9, wherein the power control apparatus has a common direct-voltage intermediate circuit and that the aforesaid DC-DC chopper is adapted to supply power between the intermediate circuit of the power control apparatus and the energy source.

11. The power control apparatus according to claim 1, wherein the power control apparatus has a common direct-voltage intermediate circuit, the apparatus comprises at least two load-side inverters electrically connected to the common direct-voltage intermediate circuit, said load-side inverters being adapted to supply power between the common direct-voltage intermediate circuit and one or more electric power machines.

12. The power control apparatus according to claim 1, wherein at least one of the switches is an IGBT transistor.

13. The power control apparatus according to claim 1, wherein all the switch modules are mounted on a common heating element.

14. The power control apparatus according to claim 1, wherein the power control apparatus has been adapted to supply power between an elevator motor and an energy source.

15. A method for supplying power by the power control apparatus of claim 5 between an electric machine and an energy source, said power control apparatus containing at least two converters comprising a plurality of switches, at least some of which switches belong to a set of switch modules comprising a plurality of switches, wherein a first set of switches belonging to at least two different modules and arranged to form a first converter is controlled by a first converter control, a second set of switches arranged to form a second converter is controlled by a second converter control, the middle bidirectional switch of a first switch module is controlled by the control of the first phase of the mains inverter, the middle bidirectional switch of a second switch module is controlled by the control of the second phase of the mains inverter and the middle bidirectional switch of a third switch module is controlled by the control of the third phase of the mains inverter, and the two outermost bidirectional switches of the first switch module are controlled simultaneously by the control of the first phase of the load-side inverter, the two outermost bidirectional switches of the second switch module are controlled simultaneously by the control of the second phase of the load-side inverter and the two outermost bidirectional switches of the third switch module are controlled simultaneously by the control of the third phase of the load-side inverter.

16. The method according to claim 15, wherein the switches of at least one module, which are arranged to form part of at least two different converters, are controlled by at least two different converter controls.

17. The method according to claim 15, wherein at least two switches in each module are controlled by the converter control of at least two different converters.

18. A method for supplying power by a power control apparatus between an electric machine and an energy source, said power control apparatus containing at least two converters comprising a plurality of switches, at least some of which switches belong to a set of switch modules comprising a plurality of switches, wherein a first set of switches belonging to at least two different modules and arranged to form a first converter is controlled by a first converter control, a second set of switches arranged to foam a second converter is controlled by a second converter control, and the method further comprises the following steps:

controlling the middle bidirectional switch of the first switch module by the control of the first phase of the mains inverter, the middle bidirectional switch of the second switch module is controlled by the control of the second phase of the mains inverter and the middle bidirectional switch of the third switch module is controlled by the control of the third phase of the mains inverter controlling the two outermost bidirectional switches of the first switch module alternately by the control of the first phase of the load-side inverter, the two outermost bidirectional switches of the second switch module are controlled alternately by the control of the second phase of the load-side inverter and the two outermost bidirectional switches of the third switch module are controlled alternately by the control of the third phase of the load-side inverter in such manner that the positive and negative change-over contacts of the bidirectional switches being controlled are turned alternately into the conducting state and both the positive and the negative change-over contacts of the bidirectional switches not being controlled are held in the non-conducting state.

* * * * *